United States Patent
Li et al.

(10) Patent No.: US 7,167,044 B2
(45) Date of Patent: Jan. 23, 2007

(54) DUAL-BAND CMOS FRONT-END WITH TWO GAIN MODES

(75) Inventors: Zhenbiao Li, Gainesville, FL (US); Kenneth K O, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 10/914,408

(22) Filed: Aug. 9, 2004

(65) Prior Publication Data

US 2005/0248402 A1    Nov. 10, 2005

Related U.S. Application Data

(60) Provisional application No. 60/569,744, filed on May 10, 2004.

(51) Int. Cl.
*H03G 3/20* (2006.01)

(52) U.S. Cl. .................. 330/129; 220/126; 220/253

(58) Field of Classification Search ............ 330/129, 330/126, 311
See application file for complete search history.

(56) References Cited

U.S. PATENT DOCUMENTS

| | | | | |
|---|---|---|---|---|
| 5,872,489 | A * | 2/1999 | Chang et al. | 330/305 |
| 6,639,468 | B1 * | 10/2003 | Belot | 330/254 |
| 6,882,223 | B1 * | 4/2005 | Hsu et al. | 330/254 |
| 2002/0167355 | A1 | 11/2002 | Jones | |
| 2004/0174928 | A1 * | 9/2004 | Siwiak et al. | 375/146 |
| 2004/0246051 | A1 | 12/2004 | Hsu et al. | |
| 2005/0231290 | A1 * | 10/2005 | Hung et al. | 330/305 |

FOREIGN PATENT DOCUMENTS

EP    1296448 A2    3/2003
WO   WO 04/010576 A1    1/2004

OTHER PUBLICATIONS

Seong-Mo Yim and Kenneth K. O., Demonstration of a Switched Resonator Concept in a Dual-Band Monolithic CMOS LC-Tuned VCO, IEEE 2001, p. 206.*

(Continued)

*Primary Examiner*—Khanh Van Nguyen
(74) *Attorney, Agent, or Firm*—Akerman Senterfitt; Neil R. Jetter

(57) ABSTRACT

A multi-band low noise amplifier (LNA) 105 includes an input stage having at least two inputs, a first input (103) coupled to a first input transistor for receiving signals in a first frequency band and a second input (104) coupled to a second input transistor for receiving signals in a second frequency band. The second frequency band spaced apart from the first frequency band. A bias network (218) having a band select input is coupled to the first and second input transistor, wherein a signal level applied to the band select input turns on one of the input transistors and turns off the other input transistors. The LNA (105) operates in the first frequency band when the first input transistor is on and the second frequency band when the second input transistor is on. A switched resonator (216) having a control input is provided, wherein application of a control signal to the control input tunes a resonant frequency of the LNA, and provides gain select, for operation in either the first or second frequency band.

15 Claims, 6 Drawing Sheets

OTHER PUBLICATIONS

Y.C. Ho et al. "3V low noise amplifier implemented using a 0.8um CMOS process with three metal layers for 900MHz operation", 1996, Elect. Lett., 32(13):1191-93.

X. Li et al. "A comparison of CMOS and SiGe LNA's and mixers for wireless LAN application", 2001, IEEE Custom Integrated Circuits Conference, pp. 531-534.

D. Shaeffer et al. "A 1.5V, 1.5GHz CMOS Low Noise Amplifier", 1996, IEEE, pp. 32-33.

Z. Li et al. "A 900-MHz 1.5-V CMOS Voltage-Controlled Oscillator Using Switched Resonators With a Wide Turning Range", 2003, IEEE, pp. 137-139.

* cited by examiner

US 7,167,044 B2

DUAL-BAND CMOS FRONT-END WITH TWO GAIN MODES

CROSS-REFERENCE TO RELATED APPLICATIONS

This application claims the benefit of U.S. Provisional Application No. 60/569,744 Entitled DUAL-BAND CMOS FRONT-END WITH TWO GAIN MODES filed on May 10, 2004, the entirety of which is incorporated herein by reference.

STATEMENT REGARDING FEDERALLY SPONSORED RESEARCH OR DEVELOPMENT

Not applicable.

FIELD OF THE INVENTION

The invention relates to receive circuitry for multi-band operation using a single set of tunable RF blocks with gain control.

BACKGROUND OF THE INVENTION

As wireless applications proliferate, the demands for radios which can support multiple bands and multiple standards are rapidly increasing. These demands are typically addressed by having two or three sets of band separated RF blocks to handle the separate bands, as well as a baseband blocks to support each RF block. This conventional arrangement increases the number of chip components and thus the overall die size, which in turn significantly increases the die cost.

SUMMARY OF THE INVENTION

A multi-band low noise amplifier (LNA) comprises an input stage including at least two inputs, a first input for receiving signals in a first frequency band and a second input for receiving signals in a second frequency band. The second frequency band is spaced apart from the first frequency band. A switched resonator has a control input, wherein application of a control signal to the control input tunes a resonant frequency of the LNA, the tuning providing operation at the first and second frequency bands.

The input stage can be an NMOS differential pair comprising a first and second input transistor. In this embodiment, the control signal disables operation in the frequency band not being utilized by turning off the first or second transistor. An inductor can be placed in series with a gate of the first and second input transistors for tuning out gate to source capacitance of these transistors.

The switched resonator preferably comprises at least one inductor. A control signal to the switched resonator controls a gain of the LNA, where the LNA provides a high and low gain mode at each of the first and second frequency bands. The first and second frequency bands can be separated by at least one octave, such as the 2.4 GHz Industrial Scientific and Medical (ISM) band and 5.15 GHz Unlicensed National Information Infrastructure (UNI) band.

Improved and smaller footprint RF receivers can be implemented using the invention. A RF receiver according to the invention can include a multi-band low noise amplifier (LNA) according to the invention and at least one antenna coupled to the inputs of the LNA. In one embodiment, a first antenna is coupled to the first input a second antenna is coupled to the second input. An RF mixer is ac coupled to an output of the LNA. Separate LNA inputs permit attainment of a desired impedance, such as 50 ohms, at band separated frequencies for the respective inputs.

BRIEF DESCRIPTION OF THE DRAWINGS

There is shown in the drawings embodiments which are presently preferred, it being understood, however, that the invention can be embodied in other forms without departing from the spirit or essential attributes thereof.

DETAILED DESCRIPTION OF THE INVENTION

A multi-band RF front-end includes a low noise amplifier (LNA) having at least two inputs. One of the inputs receives signals in a first frequency band and the other of the inputs receives signals in a second frequency band which is spaced apart from the first frequency band. The LNA includes a switched resonator having a control input. Application of a control signal to the control input of the switched resonator provides tuneability to the LNA which permits band selection and switching between operation in the first and the second frequency band. The same switched resonator also preferably provides two gain modes, a high gain mode and low gain mode. This feature relaxes the linearity and gain control requirements for the downstream IF (if applicable) and baseband blocks (not shown). Although generally described herein as a dual-band RF front-end, the invention is more generally a multi-mode RF front end as it can support three or more bands using additional input transistors and associated input matching circuitry.

A circuit according to the invention was designed and fabricated in a foundry 0.18-μm CMOS process without using deep n-wells. The invention is in no way limited to this particular process, or CMOS processes for that matter. BiMOS or bipolar processes, for example, may also be used. In the high gain mode, fabricated devices using RF front-end circuits according to the invention have demonstrated a 39.8-dB maximum voltage gain and 1.5-dB DSB noise figure (NF) at 2.4 GHz. In the 5.15 GHz band, the maximum voltage demonstrated for the same circuit was 29.2 dB and DSB NF of 4.1 dB. The invention can thus be used for multi-band communication circuits, such as those for supporting IEEE 802.11a and 802.11b applications. Although described for 2.4 GHz and 5.15 GHz band operation, the invention can be used for bands other than 2.4 GHz and 5.15 GHz.

Multi-band operation using a single set of tunable RF blocks with gain control provided by the invention can significantly reduce integrated circuit area as compared to circuits which include multiple RF blocks. For example, the chip area savings can be about 40%. Power consumption is also reduced by the invention. Moreover, the invention provides additional rejection of out of band signals compared to using broad band circuits which can be used to cover multiple bands.

Figure 1:
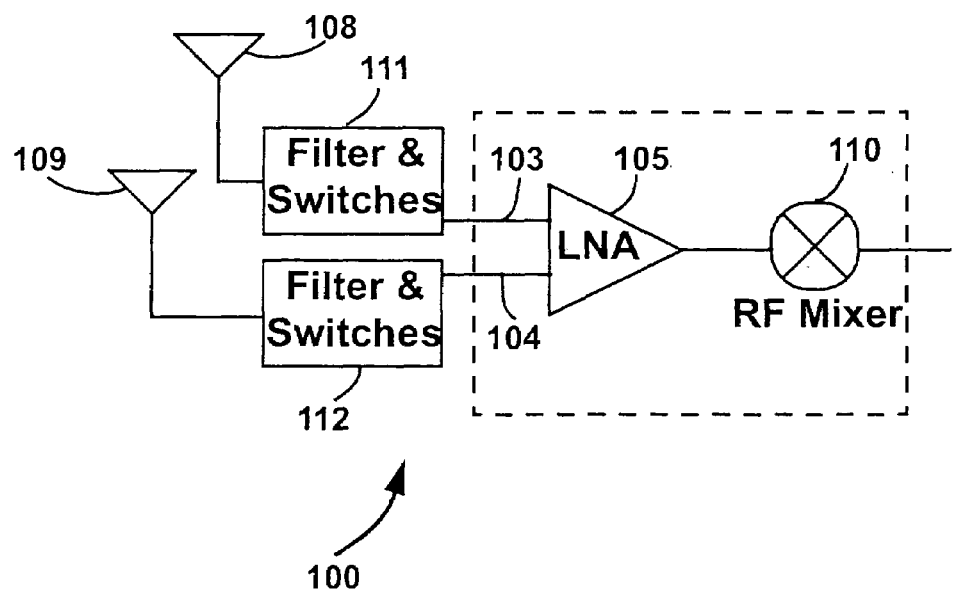
FIG. 1 shows a simplified block diagram of a tunable dual-band front-end for applications including wireless LAN applications, according to an embodiment of the invention.

FIG. 1 shows a simplified block diagram of a tunable dual-band RF front-end 100 for applications including wireless LAN applications according to an embodiment of the invention. RF front end 100 includes a two (2) input low noise amplifier (LNA) 105 and an RF mixer 110. LNA 105 has inputs 103 and 104 fed by separate antennas 108 and 109, respectively through filter and switch networks 111 and 112, respectively. Although two antennas 108 and 109 are shown in FIG. 1, a single antenna with switching architecture can also be used.

Appropriate signals applied to LNA 105 permit switching between two band separated RF bands. The switches provided by filter and switch network 111 and 112 can comprise T/R switches normally provided by wireless LAN radios.

Figure 2:
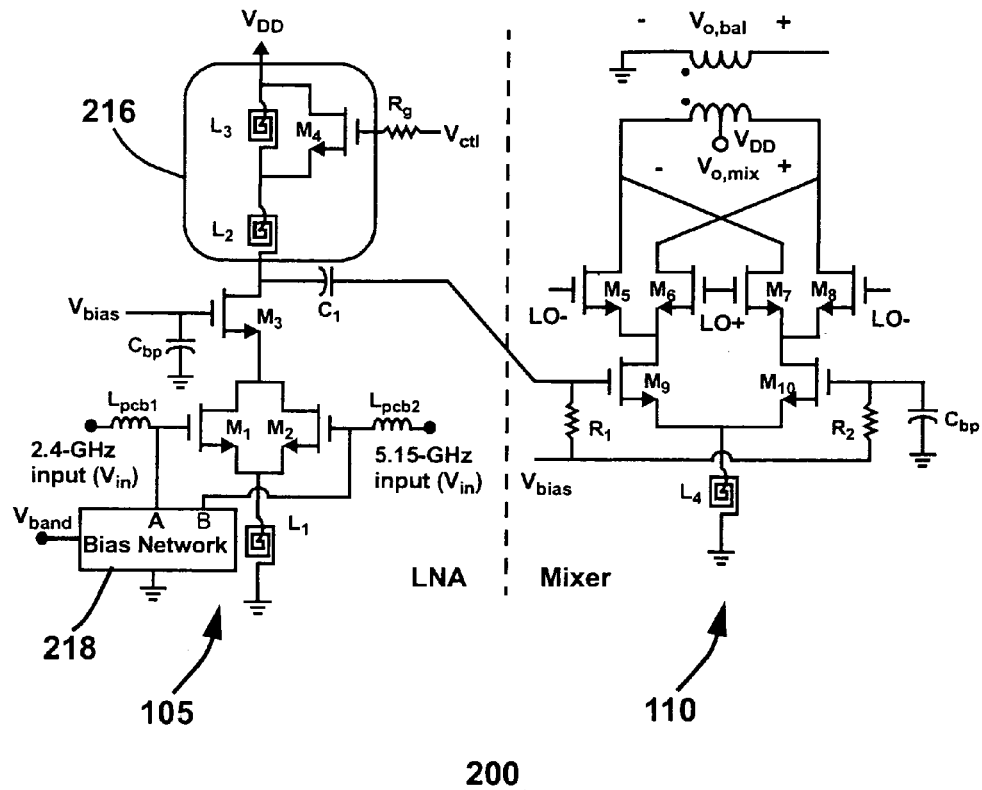
FIG. 2 shows an exemplary dual-band front-end schematic including a low noise amplifier (LNA) coupled to a RF mixer.

FIG. 2 shows an exemplary dual-band front-end circuit schematic 200 including exemplary circuitry for LNA 105 and RF mixer 110, according to an embodiment of the invention. LNA 105 includes a differential pair comprising $M_1$ and $M_2$, which are preferably low noise NMOS input transistors, and an output tuning tank comprising switched resonator 216. The switched resonator 216 performs band selection based on a signal from Vctl and gain control for LNA 105. Switched resonator 216 includes on-chip inductors $L_2$, $L_3$ and MOSFET switch $M_4$. Although shown in FIG. 2 as separate inductors, $L_2$ and $L_3$ can be embodied as a single inductor having a tap between its respective ends.

$V_{ctl}$ is the control voltage applied to the $M_4$ gate through an on-chip bias resistor $R_g$, which is chosen to be 1 kΩ. The value selected should be sufficiently large as compared to the impedance of $L_3$ to make the added loss negligible.

The LNA 105 input matching is preferably similar to that used in a single band cascode LNA. $M_1$ is for receiving signals in the first frequency band and $M_2$ is for receiving signals in the second frequency band, such as 2.4 GHz and 5.15 GHz for WLAN applications. For example, for 5.15 GHz operation, transistor $M_2$ is turned on and transistor $M_1$ is turned off. The bias network 218 shown in FIG. 3 can be used to turn on or off transistors $M_1$ and $M_2$.

LNA 105 is switched between first frequency band and the second frequency band operation by applying two signals. A first signal $V_{ctl}$ is applied to the switched resonator 216 comprising $L_2$, $L_3$ and MOSFET switch $M_4$. A second signal $V_{band}$ is applied to the bias network 218 to turn off one of $M_1$ and $M_2$ as described below.

Figure 3:
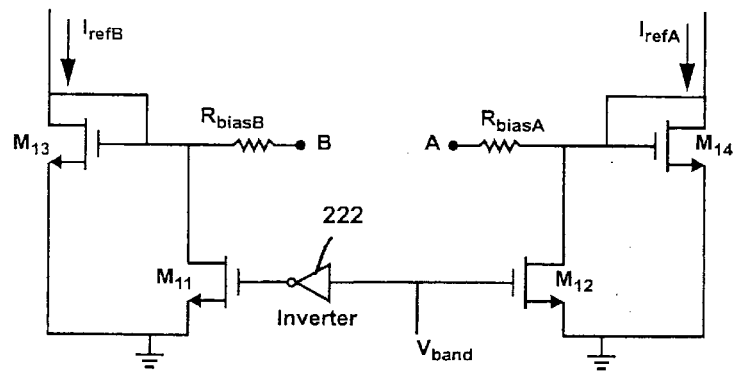
FIG. 3 shows an exemplary bias network which can be used with the invention.

FIG. 3 shows an exemplary bias network 218. Bias network 218 has two reference currents, $I_{refA}$ and $I_{refB}$, which can be used to drive $M_1$ (through Point A) and $M_2$ (through Point B), respectively. An input shown as $V_{band}$ turns on $M_{11}$ or $M_{12}$, depending on the polarity of $V_{band}$. For example, when $V_{band}$ is sufficiently positive to turn on $M_{12}$, $M_{11}$ is off due to signal inversion provided by inverter 222. When $V_{band}$ is sufficiently positive to turn on $M_{12}$, $I_{refA}$ bypasses $M_{14}$ thus rendering the gate voltage of $M_1$ and $M_{14}$ are near zero, while $I_{refB}$ will set up the proper bias gate voltage for $M_2$. Accordingly, $M_1$ is off and $M_2$ is on, thus permitting reception at only 5.15 GHz.

Circuits according to the invention thus provide tunable band selection using resonators which comprise inductors. Frequency tuning using only capacitors generally leads to unnecessarily large power consumption, especially at lower frequency bands. Switched resonators in which both capacitance and inductance are simultaneously tuned can provide a better balance between inductance and capacitance across all frequency bands and are thus preferably used for the invention. This choice leads to a better trade-off between power consumption and gain. Depending on the choice of the mixer IF frequency, this dual band radio concept can be used for either direct conversion to baseband or heterodyne architecture radios which utilize an intermediate IF frequency.

Off-chip inductors ($L_{pcb1}$ or $L_{pcb2}$) connected in series with each input $M_1$ and $M_2$ are used to tune out the gate-to-source capacitance ($C_{gs}$) at the desired band. However, $L_{pcb1}$ and $L_{pcb2}$ can be embodied as on-chip inductors. Moreover, although the antennas for the respective LNA inputs for the prototype chip designed, fabricated and tested (see Examples) was an off-chip antenna, on-chip antennas (and thus the entire circuit) can be on-chip, particularly for high frequency applications (>5 to 10 GHz) where the required physical size of the antenna begins to be practical to fit on a chip.

The LNA input matching network quality factor ($Q_{in} = (2C_{gs}\omega_o Z_o)-1$) is an important factor determining the power consumption, gain, noise, linearity and sensitivity to component variations. Here $\omega_o$ is the operating frequency and $Z_o$ is the characteristic impedance, which is typically 50 Ω. Since, the dual-band LNA has two input transistors $M_1$ and $M_2$, its input matching network can be independently optimized for each band. The LNA in a concurrent receiver has only one input transistor. Thus, for a concurrent receiver, its $Q_{in}$ depends on operation frequencies, thus usually can not be optimized for both bands.

For single band LNA's, once the common source transistor size is determined, the common-gate transistor width is preferably set to be about 60 to 100% of the width of the common source transistor width to minimize the noise factor. For dual band LNAs according to the invention, since the two parallel transistors ($M_1$ and $M_2$) increase the capacitance at the source node of the common gate transistor $M_3$, this ratio is different. The size of the common gate transistor $M_3$ was chosen to be 84 μm in the exemplary design in order to optimize noise figure in both bands. This is around 50 and 100% of the widths of $M_1$ and $M_2$, respectively.

The mixer 110 is a doubly balanced Gilbert cell which is ac coupled to the output of LNA 105 using $C_1$. Other mixer types can clearly be used with the invention. $M_9$ and $M_{10}$ form a differential pair with the gate of $M_{10}$ being ac grounded. $C_{bp}$ is an on-chip bypass capacitor, and, $R_1$ and $R_2$ are on-chip bias resistors for RF-to-DC isolation. $L_4$ is an on-chip inductor to improve mixer common mode rejection. Transistors $M_5$–$M_8$ are switching transistors driven by differential local oscillator (LO) signals. The LO frequency is changed with input frequency to keep intermediate frequency (IF) fixed, such as at 400 MHz. To drive 50 Ω measurement equipment, the mixer output signal goes directly to an off-chip center-tapped transformer/balun. In addition to differential to single end conversion, the balun transforms the 50-Ω input impedance of spectrum analyzer to 400 Ω (200 Ω for each leg). The mixer $V_{DD}$ is connected using the secondary center tap of balun.

The switched resonator 216 can also be used to control the LNA gain. Each band has two gain modes, high gain and low gain modes, corresponding to different $V_{ctl}$. For the exemplary design described herein, for high gain mode in 5.15-GHz band, $V_{ctl}$ is set to high (3.6V). The inductance and capacitance of switched resonator 216 are low and the switched resonator 216 resonates near 5.15 GHz. The low gain can be obtained by setting $V_{ctl}$ low (1.8V), and this makes the LNA output to be tuned near 2.4 GHz and causes the gain at 5.15 GHz band to be significantly reduced. The same concept is also applicable for the 2.4 GHz band. Table 1 below summarizes the LNA operation conditions. An important feature of this circuit is that the inputs stay matched in both gain modes.

TABLE 1

| $V_{ctl}$ | High | Low |
|---|---|---|
| LNA output inductance | Low | High |
| 2.4 GHz band gain | Low | Maximum |
| 5.15 GHz band gain | Maximum | Low |

Figure 4:
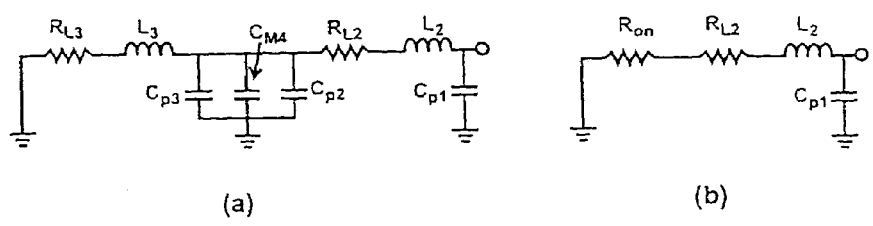
FIGS. 4(a) and (b) show simplified circuit models for a switched resonator according to the invention including two (2) inductors $L_2$, $L_3$ and a MOSFET switch when $M_4$ is off, and when $M_4$ is off and on, respectively. The switched resonator controls the LNA gain.

FIGS. 4(a) and (b) shows simplified circuit models for switched resonator 216 when $M_4$ is off and on, respectively. The impedance looking into the switched resonator 216 can be modeled as a parallel RLC circuit. When the control voltage Vctl is switched, both inductance and capacitance, as well as resistance, change in response.

The sizes of $L_2$, $L_3$ and $M_4$ of the switched resonator are generally important in determining the LNA dual-band performance. As shown in FIG. 3(a), when $M_4$ is off, its parasitic capacitance $C_{M4}$ are added to the tank as well as the $C_{p2}$ and $C_{p3}$, which are the parasitic capacitances of $L_2$ and $L_3$, respectively. $R_{L2}$ and $R_{L3}$ are the parasitic series resistances for $L_2$ and $L_3$, respectively.

$R_{on}$ in FIG. 4(b) corresponds to the on resistance of $M_4$. When $M_4$ is on, its channel resistance ($R_{on}$), which is usually about 2–3 ohms, is in series with $L_2$, and adds to $R_{L2}$ as shown in FIG. 4(b). The quality factor ($Q_L$) of the LNA output network is thus degraded.

The LNA gain is approximately proportional to $L\omega_o Q_L$, where L represents the total equivalent inductance of switched resonator 216 and $\omega_o$ is the resonant frequency. The gain will decrease at given $g_m$ when either L or $Q_L$ decreases. To mitigate this, the width of $M_4$ can be increased. However, larger $M_4$ increases parasitic capacitance $C_{M4}$ when $M_4$ is off, which in turn decreases the required inductance at the lower band. This lowers the LNA gain in the lower frequency band. Clearly, there are trade-offs for selecting $M_4$ transistor size. The size of $M_4$ should be chosen to balance LNA gains in the on and off states of the switch transistor $M_4$.

In practice, the values of $L_2$ and $L_3$, and $M_4$ width are chosen based on the LNA gain requirement. A design target for the exemplary LNA gain was 23 dB for both bands. The inductance of $L_2$ is determined by tuning the circuit near 5.15 GHz with all the parasitic capacitance on the drain node of $M_3$ including the series combination of 2-pF MIM ac coupling capacitor ($C_1$ in FIG. 2) and mixer RF transistor gate capacitors. The $M_4$ width is chosen so that the LNA voltage gain is at least 23 dB at 5.15 GHz when $M_4$ is on. Since $M_4$ behaves essentially as a short circuit (2 or 3 ohms) when it is on, it does not significantly affect the resonant frequency. Lastly, $L_3$ is added to tune the circuit at the lower band (2.4 GHz) with $M_4$ turned off. At the end of this process, if the gains are insufficient or the gain imbalance in the two bands are too large, the $g_m$'s of $M_1$ and $M_2$ can be re-adjusted and the process reiterated.

The final $M_4$ size was determined to be 315/0.18 μm for a simulated $R_{on}$ of 2.2 Ω. The control voltage for $M_4$, $V_{ctl}$, is varied between 3.6 and 1.8 V. The 3.6 V level can be generated using a voltage doubler implemented with 3.3 V I/O transistors. The use of 3.6 V, despite being twice the suggested supply voltage for the 0.18-μm CMOS process, does not result the voltage across the gate oxide of the transistors to exceed 1.8 V. Keeping the voltage across the gate oxide below 1.8 v for the process used for the exemplary circuit helps ensures the long term reliability of the circuit.

Figure 5:
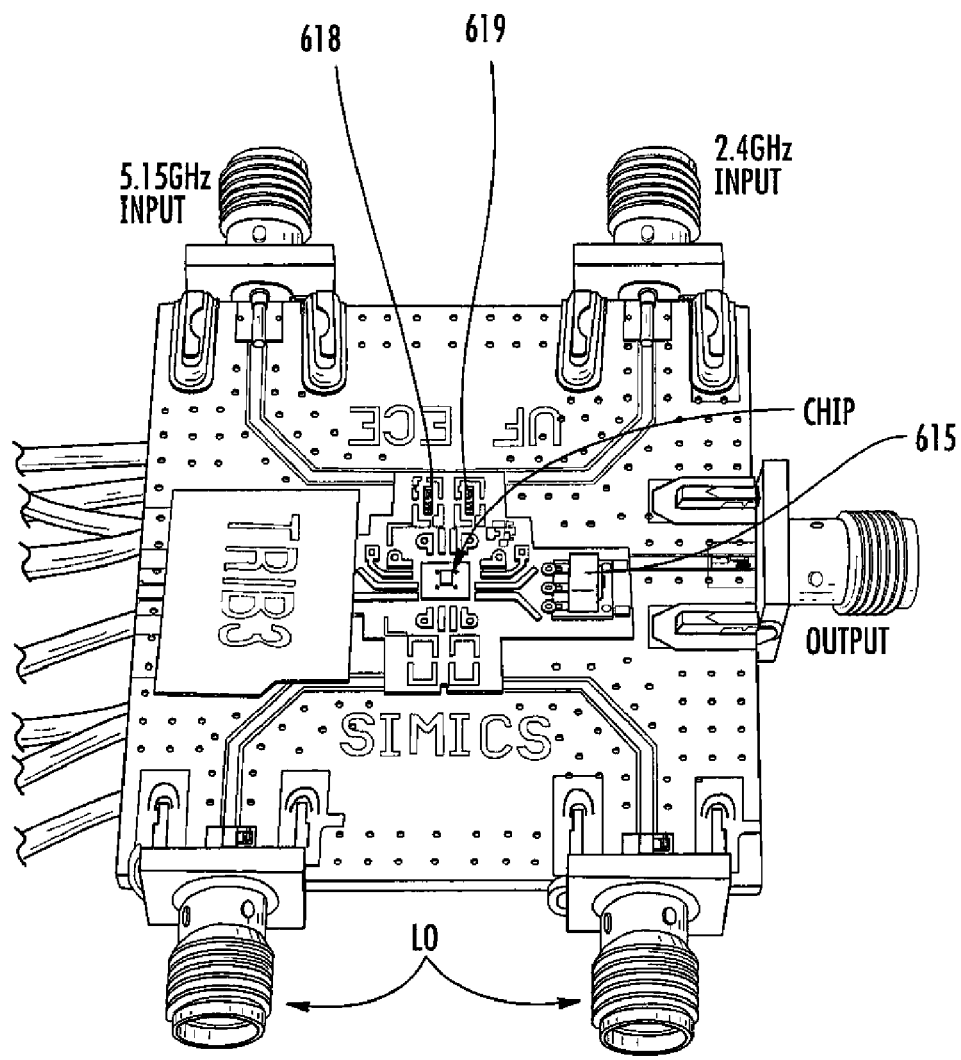
FIG. 5 shows the RF front end circuit mounted on a printed circuit board along with several off-chip components.

FIG. 5 is a photograph of the RF front end circuit mounted on a printed circuit board. The inputs masked as LO are to the local oscillator, while 600 is a chip according to the invention including LNA and mixer, 615 is the off-chip the transformer utilized by the mixer and references 618 and 619 correspond to inductors $L_{pcb1}$ and $L_{pcb2}$ which are in series with the gates of $M_1$ and $M_2$, respectively, as shown in FIG. 2.

The invention is expected to have a wide range of applications, such as in communication devices which require multi-band operation. For example, the invention can be used for wireless transceivers in communication devices, such as cell phones and personal digital Assistances (PDA's), as well as laptop computers which include communication capability.

EXAMPLES

The present invention is further illustrated by the following specific examples, which should not be constructed as limiting the scope or content of the invention in any way.

The RF front-end circuit mounted on a four-layer FR4 board shown in FIG. 6 was tested. Chip-On-Board (COB) packaging technique was used for the testing, where a fabricated bare die according to the invention was directly bonded to the Printed-Circuit Board (PCB). The measured dual-band front-end circuit characteristics are summarized in Table 2 below.

TABLE 2

| | Frequency(GHz) | | | |
|---|---|---|---|---|
| | 2.4 | | 5.15 | |
| Gain Control Mode | High | Low | High | Low |
| Power Gain (dB) | 26.5 | 9.5 | 17 | 10 |
| Voltage Gain (dB) | 39.8 | 22.8 | 29.2 | 22.2 |
| DSB NF (dB) | 1.5 | | 4.1 | |
| SSB NF Calculated from DSB NF [15] | 2.6 | | 6.2 | |
| Input $P_{1dB}$ (dBm) | −21 | −17 | −12 | −9.5 |
| $P_{1dB}$ (dBm) | 4.5 | −8.5 | 4 | −0.5 |
| Input $IP_3$ (dBm) | −12.7 | −6.6 | −4.1 | −1 |
| $IP_3$ (dBm) | 13.8 | 2.9 | 12.9 | 9 |
| $S_{11}$(dB) | −8 | −8 | −10.8 | −10.8 |

TABLE 2-continued

| | Frequency(GHz) | | | |
|---|---|---|---|---|
| | 2.4 | | 5.15 | |
| Gain Control Mode | High | Low | High | Low |
| LO to IF Isolation (dB) | >30 | | >25 | |
| $V_{DD}$(V) | 1.8 | 1.8 | 1.8 | 1.8 |
| LNA Current (mA) | 3 | 3 | 9.1 | 9.1 |
| Mixer Current (mA) | 10.6 | 10.6 | 14 | 14 |

Figure 6A:
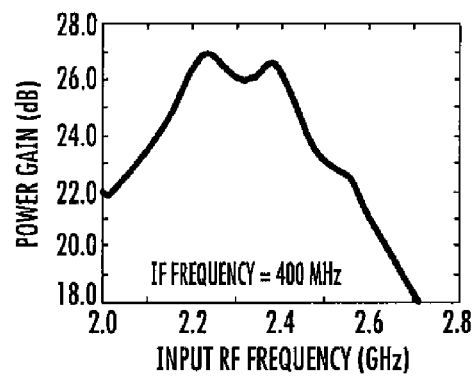
FIG. 6(a) shows the 2.4-GHz band power gain versus frequency plot at the high gain mode for a tunable RF block with gain control, according to an embodiment of the invention.

A 2.4-GHz band power gain versus frequency plot at the high gain mode is shown in FIG. 6(a). The maximum conversion power gain of the front-end was found to be 26.5 dB at 2.4 GHz. When this LNA is integrated into a receiver chain, the voltage gain ($V_{o,mix}/V_{in}$ in FIG. 2) to mixer output is a more relevant parameter. The corresponding voltage gain ($V_{o,mix}/V_{in}$) was found to be 39.8 dB. The measured double-side band (DSB) noise figure between 2.4 and 2.48 GHz (2.4 GHz ISM band) is almost constant near 1.5 dB. Using the equation given by J. Winderman,"Perform True DSB-To-SSB Noise-Figure Conversions," Microwaves, pp. 69, July 1980, the single-side band (SSB) NF is estimated to be 2.6 dB, which is considered excellent.

Figure 6B:
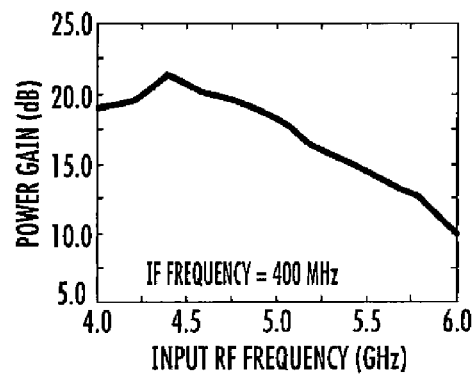
FIG. 6(b) shows the 5.1-GHz band power gain versus frequency plot at the high gain mode for a tunable RF block with gain control, according to an embodiment of the invention.

The 2.4 GHz band measurements demonstrates that the LNA output is well tuned at the high gain mode. However, the 5.15-GHz band measurements in FIG. 6(b) shows that the LNA output is mis-tuned at the high gain mode since the gain is peaked at a frequency of about 4.5 GHz. However, because of moderate tank Q, even with the resonant frequency lower than the design value, 17 dB power gain is still obtained at 5.15 GHz by increasing the LNA bias current to 9 mA. Changing the bias current from 3 mA (used for 4.4 GHz operation) to 9mA increased the power gain at 5.15 GHz by about 4 dB. The voltage gain of 29.2 dB obtained is suitable for wireless LAN applications. Changing bias currents for different band operation is quite permissible within the context of multi-band operation. Such changes are desirable to lower power consumption when not necessary.

The measured DSB noise figures (NF's) between 5.15 and 5.35 GHz vary between 4.1 and 4.2 dB at the high gain mode. When converted using techniques disclosed in J. Winderman, "Perform True DSB-To-SSB Noise-Figure Conversions," Microwaves, pp. 69, July 1980, this corresponds to 6.2 to 6.3 dB SSB NF. High NF's are due to the gain being 8 dB lower than the design. This makes the mixer noise to play a more significant role in determining the overall noise figure. With a 1.8 V supply voltage, the circuit consumes 24 mW and 41 mW for the 2.4 GHz and 5.15 GHz band operation, respectively.

Figure 7A:
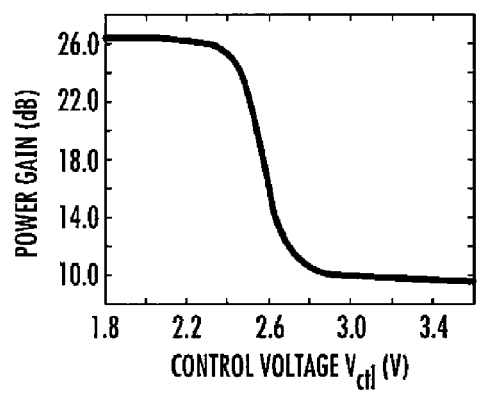
FIG. 7(a) shows the 2.4-GHz band power gain versus control voltage plot for a tunable RF block with gain control, according to an embodiment of the invention
Figure 7B:
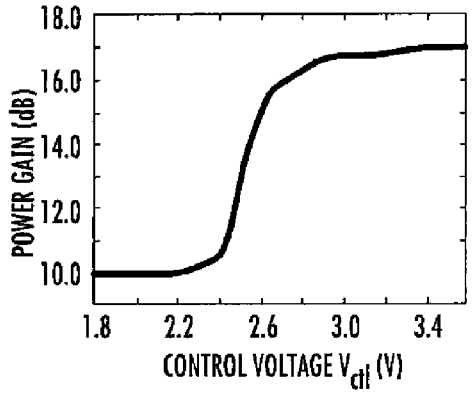
FIG. 7(b) shows the 5.1-GHz band power gain versus control voltage plot for a tunable RF block with gain control, according to an embodiment of the invention.

The front-end gain and linearity were also measured at the low gain mode. FIG. 7(a) and (b) shows the front-end power gain dependence on $M_4$ control voltage $V_{ctl}$ at 2.4 and 5.15 GHz. For 2.4 GHz operation as shown in FIG. 7(a), the power gain can he switched between 26.5 and 9.5 dB. The gain difference of 17 dB obtained should greatly help with the dynamic range when the front-end is integrated into a receiver chain. At 5.15 GHz band shown in FIG. 5(b), the low power gain is 10 dB and the gain difference between that in the high and that in the low gain mode is 7 dB.

The front-end input-referred IP3 ($IIP_3$) improves when it operates at the low gain mode. The measured IIP3 is −6.6 and −1 dBm at 2.4 and 5.15 GHz, respectively. The differences from the high gain mode are ~6 and ~3 dB, respectively. The $IIP_3$ is limited at the LNA input when the front-end operates in the low gain mode. When it operates in the high gain mode, $IIP_3$ is limited by the mixer. Because of this, the difference of $IIP_3$ does not exactly follow the gain difference. In the low gain mode, the input referred $P_{1dB}$ are −17 dBm and −9.5 dBm at 2.47 and 5.15 GHz, respectively. It is also possible to further reduce the gain and power consumption in the low gain mode by reducing the bias currents of LNA and mixer. The LNA input return loss ($S_{11}$) are the same for all the gain control modes. This is because the cascode topology of LNA has larger reverse isolation and the changes in the output matching has negligible impact on $S_{11}$. Reasonable LNA input return loss must be maintained for both high and low gain modes since LNA $S_{11}$ can affect the characteristics of preceding band pass filter (BPF).

This invention can be embodied in other forms without departing from the spirit or essential attributes thereof and, accordingly, reference should be had to the following claims rather than the foregoing specification as indicating the scope of the invention.

We claim:

1. A multi-band low noise amplifier (LNA), comprising:
an input stage including at least two inputs, a first input coupled to a first input transistor for receiving signals in a first frequency band and a second input coupled to a second input transistor for receiving signals in a second frequency band, drains of said first and second input transistor being both connected at a common node, said second frequency band spaced apart from said first frequency band,
a bias network having a band select input coupled to said first and second input transistor, wherein a signal level applied to said band select input turns on one of said input transistors and turns off one of said input transistors, said LNA operating in said first frequency band when said first input transistor is on and said second frequency band when said second input transistor is on, and
a switched resonator comprising at least one inductor having a control input coupled thereto, said switched resonator disposed in series between a power supply node and said common node, wherein application of a control signal to said control input tunes a resonant frequency of said LNA, for operation in either said first or said second frequency band.

2. The LNA of claim 1, wherein said first and second input transistors comprise a NMOS differential pair.

3. The LNA of claim 2, further comprising a single degeneration inductor, said degeneration inductor being shared by said first and said second input transistors comprising said NMOS differential pair.

4. The LNA of claim 2, further comprising an inductor in series with a gate of each of said first and second input transistors, said inductor for tuning out gate to source capacitance of said first and second input transistors.

5. The LNA of claim 1, wherein said at least one inductor comprises a first and a second inductor, said first inductor in parallel to a transistor, said first inductor and said transistor in series with said second inductor.

6. The LNA of claim 1, wherein said first and second frequency bands are separated by at least one octave.

7. The LNA of claim 6, wherein said first and second frequency bands comprise 2.4 GHz Industrial Scientific and Medical (ISM) band and 5.15 GHz Unlicensed National Information Infrastructure (UNII) band.

8. The LNA of claim 1, wherein said switched resonator is a single resonator.

9. An RF receiver, comprising:
a multi-band low noise amplifier (LNA) including an input stage including at least two inputs, a first input coupled to a first input transistor for receiving signals in a first frequency band and a second input coupled to a second input transistor for receiving signals in a second frequency band, drains of said first and second input transistor being both connected at a common node, said second frequency band spaced apart from said first frequency band, and
a bias network having a band select input coupled to said first and second input transistor, wherein a signal level applied to said band select input turns on one of said input transistors and turns off one of said input transistors, said LNA operating in said first frequency band when said first input transistor is on and said second frequency band when said second input transistor is on,
a
single switched resonator comprising at least one inductor having a control input coupled thereto, said switched resonator disposed in series between a power supply node and said common node, wherein application of a control signal to said control input tunes a resonant frequency of said LNA for operation in either said first or said second frequency band,
at least one antenna coupled to said first input and said second input transistor, and
a RF mixer ac coupled to an output of said LNA.

10. The receiver of claim 9, wherein said at least one inductor comprises a first and a second inductor, said first inductor in parallel to a transistor, said first inductor and said transistor in series with a second inductor.

11. The receiver of claim 9, further comprising a single degeneration inductor, said degeneration inductor being shared by said first and said second input transistors comprising a NMOS differential pair.

12. The receiver of claim 9, wherein said first and second frequency bands are separated by at least one octave.

13. The receiver of claim 12, wherein said first and second frequency bands comprise 2.4 GHz Industrial Scientific and Medical (ISM) band and 5.15 GHz Unlicensed National Information Infrastructure (UNII) band.

14. The receiver of claim 9, wherein said at least one antenna comprises a first antenna coupled to said first input and a second antenna coupled said second input transistor.

15. The receiver of claim 9, wherein said switched resonator is a single resonator.

* * * * *